United States Patent [19]

Nave

[11] Patent Number: 5,017,878

[45] Date of Patent: * May 21, 1991

[54] MEASURING AND LIMITING EMI WITH A DIFFERENTIAL MODE REJECTION NETWORK

[76] Inventor: Mark J. Nave, 11833 93rd Ave. North, Seminole, Fla. 33542

[*] Notice: The portion of the term of this patent subsequent to Jul. 18, 2006 has been disclaimed.

[21] Appl. No.: 356,074

[22] Filed: May 24, 1989

Related U.S. Application Data

[63] Continuation-in-part of Ser. No. 103,398, Oct. 1, 1987, Pat. No. 4,849,685.

[51] Int. Cl.$^5$ .............................................. G01R 27/00
[52] U.S. Cl. ................................................... 324/613
[58] Field of Search ..................... 324/57 N, 613, 625; 333/12, 130, 167, 181, 182, 183

[56] References Cited

U.S. PATENT DOCUMENTS 4,737,745  4/1988  Doepker .............................. 333/183
4,849,685  7/1969  Nave ................................. 324/57 N Primary Examiner—Walter E. Snow
Attorney, Agent, or Firm—Charles A. McClure

[57] ABSTRACT

Differential mode rejection networks and their use in measuring and limiting electromagnetic interference such as is conducted back into power transmission lines by noise-generating electrical equipment powered from such lines. Both single-phase and three-phase embodiments are specified. Improvement in filter design is enabled.

13 Claims, 2 Drawing Sheets

— PRIOR ART —

MEASURING AND LIMITING EMI WITH A DIFFERENTIAL MODE REJECTION NETWORK

This is a continuation-in-part of my copending application, Ser. No. 103,398 filed 1 Oct. 1987, issued as U.S. Pat. No. 4,849,685, which is incorporated herein by this reference.

TECHNICAL FIELD

This invention relates to means and methods for reduction of electromagnetic interference (EMI), such as may be conducted from electrical equipment back to input power lines, and particularly to differential mode rejection networks (DMRNs).

BACKGROUND OF THE INVENTION

Just as electrical power lines may transmit transient surges or other voltage irregularities to electrical equipment intended to be powered therefrom, so equipment in line of such power transmission may cause interfering electrical signals or noise to be conducted back to an intervening electrical bus and even to the power lines.

Such conducted emissions (CE) may degrade computer performance, television picture quality, and the functioning of other electrical equipment powered from such lines. CE types of interference may be generated by computers, radio and TV receivers, motors, switching apparatus, or almost any electrical equipment having (or causing) a varying or random emission, whether as intended output or otherwise.

Filters are useful in reducing such interference, and it is conventional—in determining the desirability and effectiveness of filters—to measure conducted emissions with an instrument often called an EMI meter or spectrum analyzer. Such a meter has a logarithmic (dB) scale and is responsive via a voltage probe or current loop throughout a frequency range up to 30 MHz or higher.

Plotting the results of such measurements reveals whatever interference peaks and bands may exist, so that adequate filters can be designed and be connected to (or be installed in) the equipment under test (EUT) to limit such interference to a tolerable level at all frequencies. Designing such filters may fairly be viewed now as principally an art rather than a science.

Examples of persons who are both workers and writers in this field include Lon M. Schneider and Alphonse A. Toppetto, as well as the present inventor. Their published articles are of more interest than are most EMI patents, although Toppetto U.S. Pat. No. 4,263,549 discloses apparatus for determining "differential mode" and "common" mode noise. Common mode (CM) current flows from phase and neutral lines to ground, whereas "differential mode" (DMI) current flows from a phase line to a neutral line. A need exists for methods and means of empirically determining with greater facility what filters are most suitable to combat both such types of conducted emissions.

SUMMARY OF THE INVENTION

My present invention is directed toward meeting the aforesaid need, for the benefit of multiple-phase electrical power lines as well as single-phase lines.

A primary object of the present invention is to facilitate the desired reduction of electromagnetic interference from electrical equipment that in its operation is a generator of unintended EMI.

Another object of this invention is to systematize designing of filters for limiting EMI to tolerable levels.

A further object of the invention is to provide a sequence of steps for measuring and limiting respective components of EMI.

Yet another object of this invention is to provide a network device useful during the performance of such sequence of steps.

A still further object of the invention is a specific design of the electrical circuit of such a network device.

In general, the objects of this invention are accomplished by excluding differential mode (from common mode) EMI conducted emissions from equipment under test (EUT) by interposing a differential mode rejection network (DMRN), measuring such common mode EMI, filtering out such common mode EMI, and then measuring such differential mode EMI. Then such differential mode EMI is filtered out also, and a composite filter—based upon both such filters is made and is interposed between the power transmission lines and the EUT.

More particularly, this invention provides designs of differential mode rejection network (DMRN) for multiple-phase, as well as single-phase, input power conditions, for use in such EMI measurement and ensuing filter design.

Other object of this invention, together with methods and means for accomplishing the various objects, will become apparent from the following description and the accompanying drawings of preferred embodiments thereof, being presented here by way of example rather than limitation.

DESCRIPTION OF THE INVENTION

Figure 1:
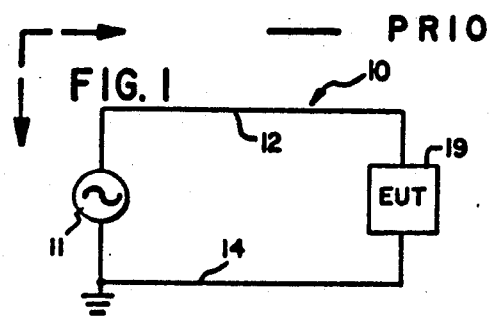
FIG. 1 is a schematic electrical diagram of the interconnection of an A.C. power source to an electrical load, here equipment to be put under test (EUT) for electromagnetic interference (EMI)

FIG. 1 shows, in conventional schematic manner, circuitry 10 wherein A.C. electrical power source 11 has ungrounded phase line 12 and grounded neutral line 14 leading to electrical load EUT 19. It will be understood, of course, that the same power lines have numerous other electrical loads (not shown) on them and that any one or more of such loads may generate EMI and propagate it as conducted emissions via the power transmission lines to other connected loads. Filters are needed between the power lines and the load equipment of such a conventional hookup to limit conduction of such emissions back to the power lines and, thus, to other equipment so powered.

Figure 2A:
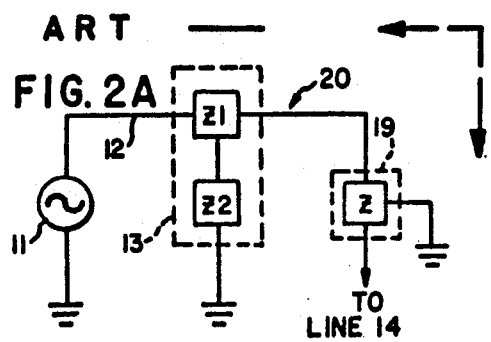
FIG. 2A is a similar schematic view of a power line impedance stabilization network (LISN) interposed between the power source and the EUT—only one of the power lines to the EUT being shown, for the sake of simplicity.

FIG. 2A shows in similar manner circuitry 20, wherein LISN 13 is interposed between line 12 and ground. The LISN is intended to provide a stabilized impedance to emissions conducted from the EUT to the power lines, without interference with the normal supply of power to the EUT. Grounded neutral line 14 (not shown here) is also provided with a like LISN. LISN 13 is made up of first impedance element Z1 (largely inductive) in series in the line and second impedance element Z2 (largely capacitive) between the first one and ground. Impedance Z of the EUT is also shown as connected to ground (parasitic) and to neutral line 14, whereupon it can be thought of as between the phase and neutral lines and ground. A corresponding three-phase arrangement (not shown) can be readily visualized as, for example, FIG. 2A tripled (once for each phased power line) plus a grounded neutral line in common among them.

Figure 2B:
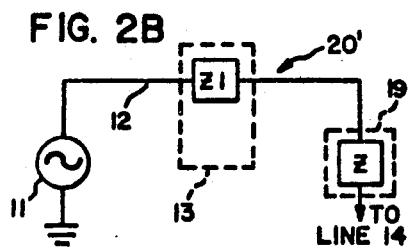
FIGS. 2B and 2C are views showing the equivalent electrical circuits of the Apparatus of FIG. 2 at, respectively, conventional power frequency and a much higher frequency characterized by EMI.

FIG. 2B shows effective circuitry 20' of the apparatus of FIG. 2A at power frequency, say 50 to 60 Hz, whereby inductive Z1 is low in impedance, and capacitive Z2 is so high in impedance as to be practically and open circuit—and, therefore, is omitted from view. An analogous three-phase equivalent circuit (not shown) is readily apparent to persons ordinarily skilled in the electrical power art, corresponding to the foregoing suggestion (with regard to FIG. 2A).

Figure 2C:
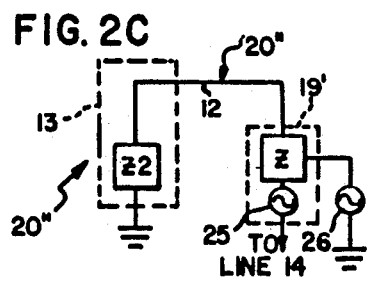

FIG. 2C shows effective circuitry 20'' of the apparatus of FIG. 2A at high or noise frequency, whereby inductive Z1 is so high in impedance as to be practically an open circuit and, thus, is omitted from this view—along with the power source—whereas capacitive Z2 is very low in impedance. EMI source 25 (DM) is indicated in series between impedance element Z within the EUT (now designated 19') and neutral line 14, and EMI source 26 (CM) is indicated in series between the same impedance element and ground. Again an analogous three-phase equivalent circuit (not shown) will be readily apparent to persons ordinarily skilled in the electrical power art.

Figure 3:
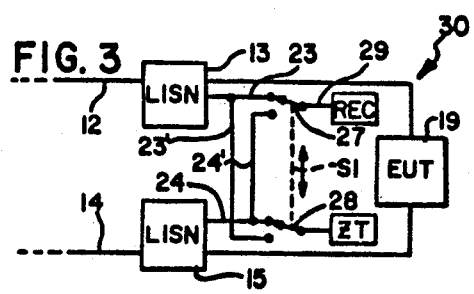
FIG. 3 is a schematic view of the same apparatus connected conventionally to an EMI receiver for measurement of its EMI.

FIG. 3 shows schematically conventional circuitry 30, wherein LISN 13 is interposed in phase line 12, and LISN 15 is interposed in neutral line 14 leading to EUT 19, and wherein EMI receiver 18 and equivalent termination impedance ZT are connectable alternately via double-pole double-throw switch S1 to the respective LISNs. Here upper switch arm 27 connects the phase line LISN (via lead 23) to EMI receiver (REC) lead 29, while lower switch arm 28 connects the neutral line LISN (via lead 24) to the ZT unnumbered lead. Such switch setting leaves unconnected alternative LISN leads 23' and 24' which interchange the LISN connections to REC and ZT.

Such a conventional measuring arrangement fails to distinguish between "common mode" conducted emissions and "differential mode" conducted emissions, leaving filter design quite experimental and uncertain—even when the desirability of distinguishing between CM CE and DM CE is appreciated. The next views further emphasize that customary failure to cope with the practical problem.

Figure 4A:
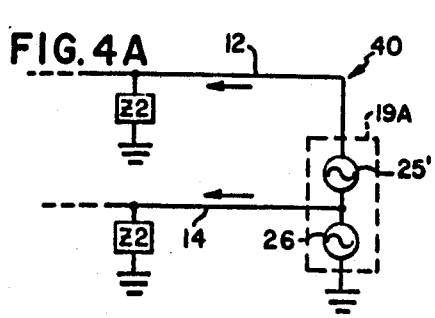
FIGS. 4A and 4B are schematic diagrams of "common mode" (CM) and "differential mode" (DM) conducted emissions (CE) from the EUT, especially part thereof acting to generate noise.

FIG. 4A shows schematically effective circuitry 40' of CM CE at high or noise frequencies. Impedance elements Z2 between ground and respective phase and neutral power lines 12 and 14 receive currents from indicated source 25'—denoting whatever component(s) of the EUT act(s) as a source of such EMI. As CM CE currents (arrows) flow in the same direction at any given time in each of the power lines, source 26 is shown between both lines and ground. the EUT itself is marked 19A to distinguish it from its previous simpler representation, and load Z is omitted. An analogous three-phase equivalent circuit (not shown) is readily apparent to persons ordinarily skilled in the electrical power art. Thus, there would be a source of EMI (CM) in each phase line with current flow to ground from all of the lines, including the common or neutral line.

Figure 4B:
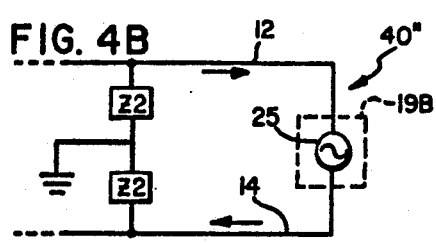

FIG. 4B shows similarly the effective circuitry 40'' of DM CE at high or noise frequencies. Pair of impedance elements Z2 between respective phase and neutral power lines 12 and 14 and ground receive currents from source 25 of the EUT (now 19B) and circulate or flow in opposite directions in the two lines. Here again an analogous three-phase equivalent circuit (not shown) is readily apparent to persons ordinarily skilled in the electrical power art. Then there would be a source of EMI (DM) in each phase line.

Figure 5:
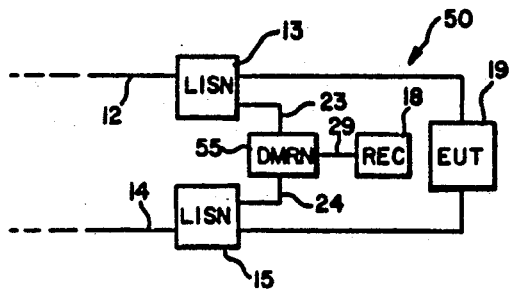
FIG. 5 is a schematic electrical diagram of the connection of the EUT and the EMI receiver as in FIG. 3, with the addition of a differential mode rejection network (DMRN) interposed between the line impedance stabilization networks (LISNs) and the receiver, in accordance with this invention.

FIG. 5 shows schematically circuitry 50 for use in practicing the method of the present invention. This arrangement resembles FIG. 3 except that "differential mode rejection network" (DMRN) 55 is interposed between EMI receiver 18 and respective leads 23 and 24 to the LISNs. The utility of such DMRN will become apparent in the description of how and when to use it in measurements of EMI.

Figure 6A:
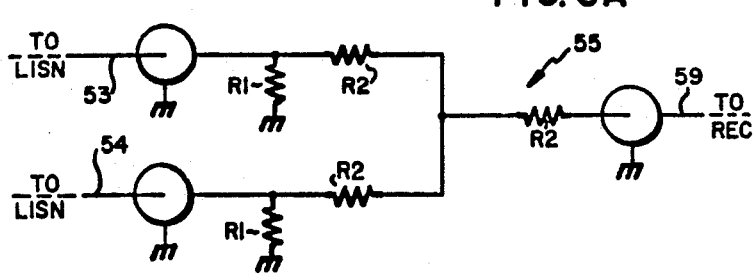
FIG. 6A is a schematic of such DMRN electrical circuitry for use with single-phase input power sources.

FIG. 6A shows single-phase power circuit elements and interconnections of DMRN 55, which is shown with shielded leads—indicated by the surrounding grounded circles—namely, leads 53 and 54 to go to the respective LISN leads (23 and 25, not shown here) at the left and shielded lead 59 to the receiver (REC) lead (29, not shown here) at the right. Internally, the DMRN,s left or LISN leads have respective resistors R1 connected thereto, with their (R1s,) other terminals grounded. Pair of resistors R2 are connected in series between the respective R1 LISN lead junctions, and a third R2 resistor connects from the paired R2 mutual junction to the REC lead.

Figure 6B:
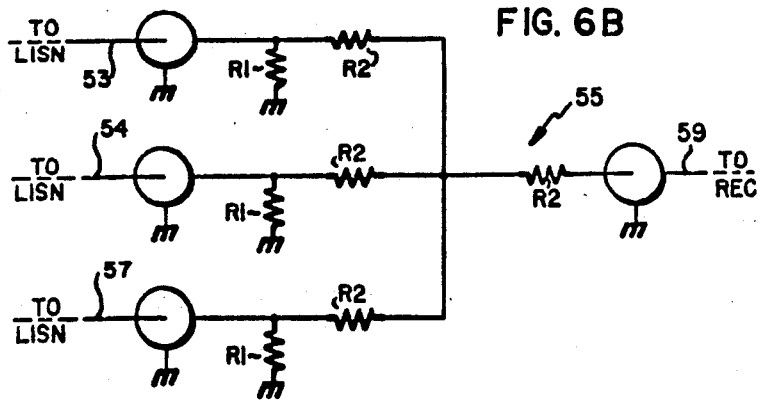
FIG. 6B is a schematic of such DMRN electrical circuitry for use with three-phase input power sources having a delta configuration.
Figure 6C:
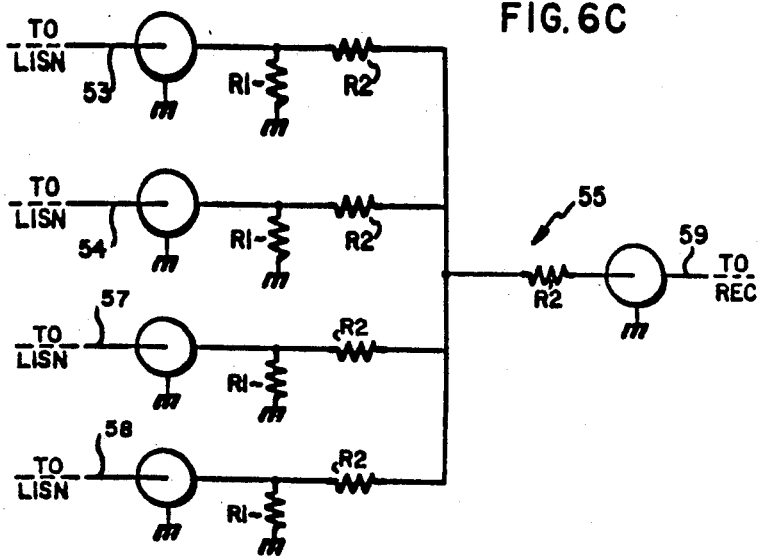
FIG. 6C is a schematic of such DMRN electrical circuitry for use with three-phase input power sources having a wye configuration.

FIGS. 6B and 6C show corresponding three-phase power circuit elements and interconnections of similarly augmented DMRNs. FIG. 6B shows such a DMRN for delta-connected three-phase power input lines 63, 64, and 67; whereas FIG. 6C shows such a DMRN for wye-connected three-phase power input lines 63, 64, 67, and 68—LISNS being used in each such line for present purposes, of course. That these views are analogous to the previous single-phase showing is readily understood by persons ordinarily skilled in providing multiple-phase A.C.

In view of the standard (in the U.S.) termination requirement of 50 ohms for LISNs and for an EMI receiver, the values of the respective resistors in the respective cases are readily computed. The total DMRN resistive impedance value consists of three additive parts (from left to right in FIGS. 6A,B,C): R1/n and R2/n and R2, where n equals the number of power lines. In the single-phase (FIG. 6A) embodiment n=2, R1=50, R2=16 ⅔; so 25+8 ⅓+16 ⅔=50. In a delta three-phase (FIG. 6B) embodiment, n=3, R1=50, R2=25; so 16⅔+8⅓+25 =50. In a wye three-phase embodiment, n=4, R1=50, R2=30; so 12½+7½+30=50.

In European countries a higher LISN impedance (say, 100 or 150 ohms) is customary and DMRN resistor values can be scaled readily (proportionately) from the 50-ohm termination and R1's 50-ohm value, the R2 values for the respective arrangements being scaled likewise.

Such DMRN is used in only a part of an EMI measuring process, but its use is critical to success of the measurement and to the effectiveness of consequent filter design, as will be understood from the next diagram and from description of it and subsequent views.

Figure 7:
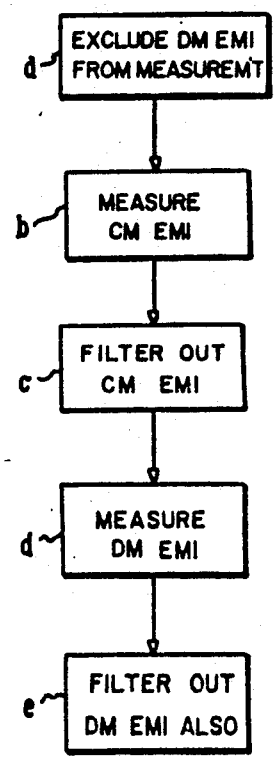
FIG. 7 is a block diagram of a method of limiting EMI from an EUT according to this invention, using such a DMRN as in FIG. 5.

FIG. 7 shows in block form successive steps of the present invention, characterizable succinctly as a preliminary step of (i) excluding differential mode conductive emissions followed by the steps of (ii) measuring the remaining or common mode conductive emissions, (iii) filtering such CM CE out, (iv) measuring the remaining (now unexcluded) DM CE, and (v) filtering the DM CE out also.

These five steps may be rendered in greater detail by reciting also their related equipment aspects for any given EUT, as follows:
 a. excluding from EUT measurement EMI attributable to current flow between phase and neutral lines, as "differential mode" (DM) EMI;
 b. measuring remaining EMI from the EUT, attributable to current flow from such neutral and phase lines to ground, as "common mode" (CM) EMI;
 c. providing first filter means between the power lines and the EUT effective to diminish such CM EMI to at most a preselected acceptable value;
 d. measuring remaining EMI from the EUT, attributable in major part to undiminished DM EMI, and perhaps in minor part to such diminished CM EMI; and
 e. providing second filter means between the power lines and the EUT effective to diminish such DM EMI to such an extent that the total EMI from the EUT is diminished to at most a preselected acceptable value.

Figure 8A:
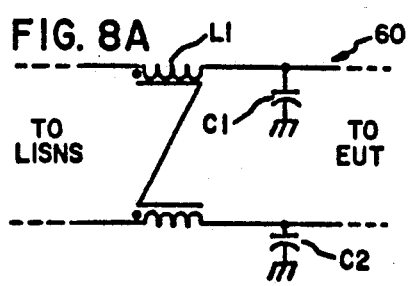
FIGS. 8A, 8B, and 8C are schematic representations of an EUT with, respectively, a CM filter, a DM filter, and a composite or resulting filter interposed between it and the input power lines.
Figure 8B:
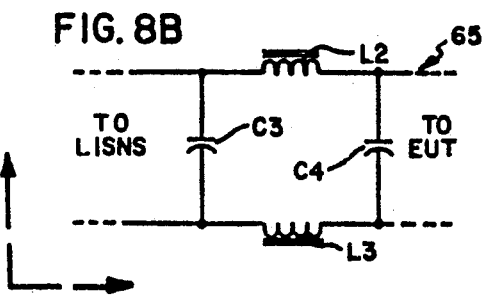
Figure 8C:
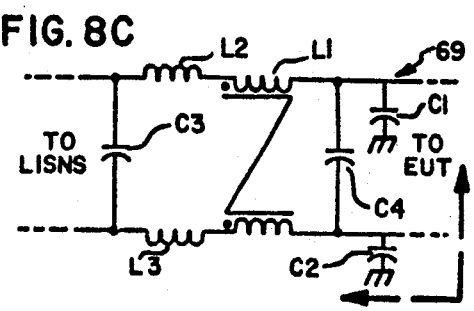

FIGS. 8A, 8B, and 8C illustrate circuitry generally, whether in the prior art (as marked) or according to this invention when this teaching is followed therein. Whereas prior art methodology at best only approximates effective values, in the practice of this invention the specified values of the various circuit elements provide highly effective filtering out of EMI. These last three views are described here principally from this improved perspective with reference to the foregoing sequence of steps, notwithstanding application of the illustrations generally to attempts of the prior art to accomplish effective EMI filtering.

FIG. 8A shows schematically the apparatus upon interposition of CM filter 60 between the power lines and the EUT after step (b); FIG. 8B shows additionally interposed DM filter 65 after step (d); and FIG. 8C shows filter 69, a composite of 60 and 65 so interposed. Producing such a composite filter from two individually determined filters is well known and can be accomplished by persons of ordinary skill, once values of the respective filter components are known.

As shown in FIG. 8A, CM filter 60 has inductor L1 (with a high-permeability core) in each LISN lead (out of view) and has a pair of capacitors C1 and C2 to ground from the respective leads to the EUT. In FIG. 8B, DM filter 65 has a pair of inductors L2 and L3 in the respective leads, and a pair of capacitors C3 and C4 interconnected between the respective leads and flanking both the inductors. Composite filter 69 in FIG. 8C combines the features of the filters of FIGS. 8A and 8B very beneficially according to the invention.

Only single-phase power supply arrangements are illustrated in these final views to simplify the diagrams, but corresponding three-phase illustration would be analogous and readily visualized.

Notwithstanding the specificity of the foregoing description, variants have been suggested, and other modification may be made, as by adding, combining, deleting, or subdividing parts or steps, while retaining at least part of the advantages and benefits of the present invention—which itself is defined in the following claims.

The claimed invention:

1. Differential mode rejection network (DMRN) useful in the measurement of electromagnetic interference (EMI) from electrical equipment powered from a given plurality of electrical transmission lines through respective line impedance stabilization networks, by means of an EMI receiver, and useful in the design of filters for limiting EMI conducted emissions (CE) to such lines, comprising
 a like plurality of first circuit elements, each having a given first resistive impedance (R1), for connection in series between the respective transmission lines and ground; and
 a like plurality of second circuit elements, each having a given resistive impedance (R2) unlike the first, for connection in series from such transmission lines to a junction of second circuit elements, and another such second circuit element for connection in series from such junction to an EMI receiver.

2. Differential mode rejection network (DMRN) useful in the measurement of electromagnetic interference (EMI) from electrical equipment powered from a given plurality of electrical transmission lines through respective line impedance stabilization networks, by means of an EMI receiver, and useful in the design of filters for limiting EMI conducted emissions (CE) to such lines, comprising
 a like plurality of first circuit elements, each having a given first resistive impedance (R1), for connection in series between the respective transmission lines and ground; and
 a like plurality of second circuit elements, each having a given resistive impedance (R2) unlike the first, for connection in series from such transmission lines to a junction of second circuit elements, and another such second circuit element for connection in series from such junction to an EMI receiver;

wherein the first resistive impedance is predetermined in accordance with required termination impedance for an EMI receiver used as a standard test instrument, and wherein the value of R1 is so predetermined, and the value of R2 is such that the sum R2+(R1+R2)/n = R1, where n is the number of transmission lines.

3. A DMRN according to claim 1, wherein R1 equals 50 ohms.

4. A DMRN according to claim 3, for use with power from single-phase transmission lines, wherein R2 equals 16⅔ ohms.

5. A DMRN according to claim 3, for use with power from delta-connected three-phase transmission lines, wherein R2 equals 25 ohms.

6. A DMRN according to claim 3, for use with power from wye-connected three-phase transmission lines, wherein R2 equals 30 ohms.

7. A DMRN according to claim 1, comprising
electrical circuitry including such R1 and R2 circuit elements, and leads therefrom for connection to the respective transmission lines and another lead for connection to the EMI receiver.

8. In apparatus including receiving means for measuring electromagnetic interference (EMI) conducted emissions (CE) from electrical equipment under test (EUT) powered by an electrical power source via transmission lines having line impedance stabilization networks (LISNs) interposed between the respective lines and the EUT during measurement, the improvement comprising
a differential mode rejection network (DMRN) connected between the LISNs and the receiving means,
effective to exclude differential mode (DM) CE from measurement, and having
a given resistance between each LISN and ground, and
a like resistance between the power lines and the receiving means,
adapted for use with three-phase power transmission lines.

9. A DMRN according to claim 8, wherein the power lines are delta-connected.

10. A DMRN according to claim 8, wherein the power lines are wye-connected.

11. In measuring electromagnetic interference (EMI) from electrical equipment under test (EUT) powered from an electrical power source via transmission lines, including a plurality of phase lines, the improvement comprising the steps of
interposing a line impedance stabilization network (LISN) between each such power line and the measuring location and then
first segregating from measurement that portion of EMI from the EUT attributable to current flow between such phase lines as differential mode (DM) EMI;
next measuring that portion of EMI from the EUT attributable to current flow between phase lines and ground as common mode (CM) EMI; and
then measuring the DM EMI after filtering out such previously measured CM EMI;
wherein the DM EMI is so segregated from the CM EMI by interposing a differential mode rejection network (DMRN) between such LISNs and the measuring location during the measurement of CM EMI, such DMRN comprising
first circuit elements each having a first resistance value, connected in series between the respective lines and ground; and
second circuit elements each having a second resistance value, connected in series from the respective lines to a junction of such second circuit elements and an additional such second circuit element connected between such junction thereof and the EUT.

12. EMI measurement method according to claim 11, wherein the transmission lines are delta-connected three-phase, and the DMRN is designed for connection to such three-phase power lines.

13. EMI measurement method according to claim 11, wherein the transmission lines are wye-connected three-phase, and the DMRN is designed for connection to such three-phase power lines.

* * * * *